United States Patent
Park

(10) Patent No.: US 7,135,403 B2
(45) Date of Patent: Nov. 14, 2006

(54) METHOD FOR FORMING METAL INTERCONNECTION LINE IN SEMICONDUCTOR DEVICE

(75) Inventor: Chang-Soo Park, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 143 days.

(21) Appl. No.: 10/878,288

(22) Filed: Jun. 29, 2004

(65) Prior Publication Data

US 2005/0085070 A1 Apr. 21, 2005

(30) Foreign Application Priority Data

Oct. 20, 2003 (KR) .................... 10-2003-0073067

(51) Int. Cl.
*H01L 21/4763* (2006.01)
(52) U.S. Cl. .................. 438/643; 438/637; 438/640
(58) Field of Classification Search ............. 438/643, 438/637, 640, 626, 645, 952
See application file for complete search history.

(56) References Cited

U.S. PATENT DOCUMENTS

| | | | | |
|---|---|---|---|---|
| 5,470,792 A | * | 11/1995 | Yamada | 438/625 |
| 6,060,385 A | * | 5/2000 | Givens | 438/626 |
| 6,787,468 B1 | * | 9/2004 | Kim et al. | 438/688 |
| 2002/0132472 A1 | * | 9/2002 | Park | 438/641 |

FOREIGN PATENT DOCUMENTS

| | | | |
|---|---|---|---|
| KR | 1999-17335 | | 3/1999 |
| KR | 2001109959 | * | 12/2001 |
| KR | 2002-72996 | | 9/2002 |
| KR | 200272996 | * | 9/2002 |

OTHER PUBLICATIONS

Notice of Preliminary Rejection mailed on Dec. 7, 2005, issued by the Korean Patent Office in counterpart Korean Application No. 2003-73067 and English translation thereof.

* cited by examiner

*Primary Examiner*—Michael Lebentritt
*Assistant Examiner*—Mohsen Ahmadi
(74) *Attorney, Agent, or Firm*—Finnegan, Henderson, Farabow, Garrett & Dunner, L.L.P.

(57) ABSTRACT

Disclosed is a method for forming a metal interconnection line in a semiconductor device. The method includes the steps of: forming an inter-layer insulation layer on a substrate, the inter-layer insulation layer having at least one contact hole exposing a portion of the substrate; forming a barrier metal layer on a bottom of said at least one contact hole and an upper surface of the inter-layer insulation layer; forming an amorphous seed layer on said at least one contact hole; converting portions of the seed layer disposed on an upper part of said at least one contact hole into a metal deposition blocking layer; selectively forming at least one adhesion layer on the bottom and sidewalls of said at least one contact hole by using the seed layer; and selectively forming at least one plug inside of said at least one contact hole.

19 Claims, 7 Drawing Sheets

METHOD FOR FORMING METAL INTERCONNECTION LINE IN SEMICONDUCTOR DEVICE

FIELD OF THE INVENTION

The present invention relates to a method for forming a metal interconnection line in a semiconductor device; and, more particularly, to a method for forming a metal interconnection line in a semiconductor device through the use of a selective deposition method.

DESCRIPTION OF RELATED ARTS

As semiconductor devices have been high-speeded and highly integrated, such a metal as tungsten is used to form a plug for burying a contact hole or a via hole having a high aspect ratio.

Such a plug made of tungsten is formed by employing a series of processes. First, a tungsten layer is deposited on an entire surface of a substrate structure, in which a contact hole exposing a bottom conductive layer or a substrate is formed in an inter-layer insulation layer, by employing a chemical vapor deposition (CVD) method having an excellent step-coverage property. Then, a portion of the tungsten layer disposed on the inter-layer insulation layer is removed by performing a chemical mechanical polishing (CMP) process. Herein, the CMP process proceeds under a target of making the tungsten layer remain only inside of the contact hole. A wet cleaning process is performed after the CMP process in order to remove metal remnants. Also, prior to the deposition of the tungsten layer, an adhesion layer made of titanium (Ti) or titanium nitride (TiN) can be additionally formed on the substrate structure to obtain adhesion between the tungsten layer and the inter-layer insulation layer and to reduce a contact resistance between the tungsten layer and the bottom conductive layer.

However, the above explained method of forming a tungsten plug may have several disadvantages in high manufacturing costs and elongated processing time caused by the complexity in processes including several steps of the adhesion layer deposition, the tungsten layer deposition, the CMP process, and the wet cleaning process. Also, the above method is disadvantageous that metal remnants may still remain after the wet cleaning process. These remaining metal remnants may become a cause for creating device defects such as bridge formation during a subsequent process for forming interconnection lines, thereby degrading reliability and yields of semiconductor devices.

To solve the above problems, it is contrived to form a tungsten plug through selectively growing a tungsten layer. In detail of this selective deposition method, the tungsten layer is selectively grown inside of each contact hole with use of a difference in deposition characteristics between a bottom conductive layer exposed at a bottom of the contact hole and an inter-layer insulation layer at sidewalls of the contact hole. Thus, it is unnecessary to form an adhesion layer and perform a CMP process and a wet cleaning process. This effect results in simplification of the tungsten plug formation process and bare generation of metal remnants. As a result, it is possible to prevent generation of defects, e.g., bridge formation.

However, this method has several disadvantages. In case that the contact holes have different depths, the tungsten plug becomes protruded from the shallow contact hole. In this case, a CMP process and a wet cleaning process need to be performed to remove the protruded tungsten plug. Also, during the selective growth of the tungsten layer, tungsten becomes diffused into the substrate, resulting in formation of wormholes. These wormholes are causes for generating leakage currents which induce device defects. Also, because of a gap formed between the tungsten plug and sidewalls of the contact hole, the tungsten burial is incomplete, inducing degradation of reliability of interconnection lines.

A method for preventing a metal plug from being protruded from a shallow contact hole is disclosed in the Korean patent application No. 1997-40236, issued to Mi Yeong Yoon and et al. on Aug. 22, 1997, entitled "Method for Manufacturing Metal Interconnection of Semiconductor Device." In order to achieve this effect, a low resistive metal layer, e.g., a Ti layer, and a barrier metal layer, e.g., a TiN layer, are formed on a contact hole and an inter-layer insulation layer by employing a sputtering method. Then, a metal deposition blocking layer is formed only on the inter-layer insulation layer through forming and subsequently oxidizing an aluminum layer. The metal plug is selectively grown only inside of the contact hole in which the barrier metal layer is formed. As a result, the tungsten plug can be completely filled into a deep contact hole as simultaneous as the protrusion of the metal plug from the shallow contact hole is impeded.

However, an increase in a depth difference between contact holes and a rapid decrease in a diameter of the contact hole causes the barrier metal layer to have a poor step-coverage property at sidewalls of the contact hole. Thus, even though the metal deposition blocking layer is formed, the protrusion of the metal plug from the shallow contact hole may still be observed, and a period for forming the metal plug may be elongated.

To solve these problems, a CVD method is used to form a barrier metal layer instead of the sputtering method. In this case, the use of an inorganic compound such as titanium tetrachloride ($TiCl_4$) as a source gas necessitates a high deposition temperature greater than 600° C. Hence, the barrier metal layer and a substrate become extensively reactive, causing leakage currents to be increasingly generated and interconnection lines to become defective due to a remaining corrosive element such as chlorine, which corrodes the metal plug and the metal interconnection lines. Meanwhile, the use of a metal-containing organic material makes it possible to proceed a deposition at a low temperature, but leads the barrier metal layer to have an increased resistivity because of remaining carbon impurities and to have a poor step-coverage property in a deep contact hole.

Also, in case of using copper (Cu) as an interconnection line material and a plug material, it is necessary to form the barrier metal layer with an increased thickness because of higher diffusiveness of Cu. Thus, instead of the use of a TiN layer, a tantalum nitride (TaN) layer which has a high resistivity, but has a good barrier characteristic is used. However, this use of the TaN adversely results in further deterioration of a resistance characteristic of an interconnection line. Compared with a case of the formation of a Cu interconnection line through a single damascene process, this resistance characteristic of the Cu interconnection line may become much severely deteriorated if the Cu interconnection line is formed through a dual damascene process.

SUMMARY OF THE INVENTION

It is, therefore, an object of the present invention to provide a method for forming a metal interconnection line in a semiconductor device through a simplified process along with an improvement on reliability of the metal interconnection line achieved by completely burying fine contact holes having different heights.

It is another object of the present invention to provide a method for forming a metal interconnection line in a semiconductor device capable of improving a resistance characteristic of a metal interconnection line in case of the application of a damascene process.

In accordance with an aspect of the present invention, there is provided a method for forming a metal interconnection line in a semiconductor device, including the steps of: forming an inter-layer insulation layer on a substrate, the inter-layer insulation layer having at least one contact hole exposing a portion of the substrate; forming a barrier metal layer on a bottom of said at least one contact hole and an upper surface of the inter-layer insulation layer; forming an amorphous seed layer on said at least one contact hole; converting portions of the seed layer disposed on an upper part of said at least one contact hole into a metal deposition blocking layer; selectively forming at least one adhesion layer on the bottom and sidewalls of said at least one contact hole by using the seed layer; and selectively forming at least one plug inside of said at least one contact hole.

In accordance with another aspect of the present invention, there is provided a method for forming a metal interconnection line in a semiconductor device, including the steps of: forming an inter-layer insulation layer on a substrate, the inter-layer insulation layer having at least one contact hole exposing a portion of the substrate; forming a first barrier metal layer on a bottom of said at least one contact hole and an upper surface of the inter-layer insulation layer; forming an amorphous seed layer on said at least one contact hole; converting portions of the seed layer disposed on an upper part of said at least one contact hole into a metal deposition blocking layer; forming a second barrier metal layer on the bottom and sidewalls of said at least one contact hole by using the seed layer; and selectively forming the metal interconnection line inside of said at least one contact hole.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for forming a metal interconnection line in a semiconductor device in accordance with a preferred embodiment of the present invention will be described in detail with reference to the accompanying drawings, which is set forth hereinafter.

FIGS. 1A to 1F are cross-sectional views illustrating a method for forming a metal interconnection line in a semiconductor device with the application of a metal plug in accordance with a first embodiment of the present invention.

Figure 1A:
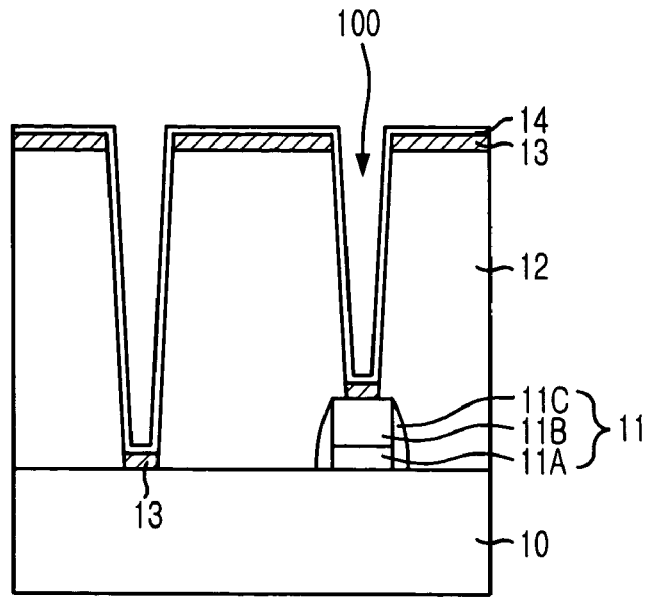
FIGS. 1A to 1F are cross-sectional views illustrating a method for forming a metal interconnection line in a semiconductor device with the application of a metal plug in accordance with a first embodiment of the present invention.

Referring to FIG. 1A, a gate structure 11 including a gate conductive material 11A, a gate hard mask 11B and a gate spacer 11C is formed on a substrate 10. An inter-layer insulation layer 12 is overlaid on the above resulting substrate structure. Then, the inter-layer insulation layer 12 is etched by performing a dry etching process to thereby form a plurality of contact holes 100 having different depths and exposing portions of the gate structure 11 and the substrate 10. A wet etching process is performed to remove a native oxide layer and impurities existing inside of the contact holes 100. Herein, the wet etching process uses a solution obtained by mixing sulfuric acid ($H_2SO_4$) and hydrofluoric acid (HF) in a ratio of approximately 200 to approximately 1.

After the wet etching process, a titanium (Ti)/titanium nitride (TiN) layer 13 serving as a low resistive and barrier metal layer is formed on each bottom of the contact holes 100 and upper surfaces of the inter-layer insulation layer 12 by employing a physical vapor deposition (PVD) method having a poor step-coverage property at sidewalls of the contact holes 100. Examples of such PVD method are an ionized metal plasma (IMP) method, a long through sputtering method and a collimated deposition method.

Subsequently, the above substrate structure is treated with silane ($SiH_4$) gas to form an amorphous $SiH_x$ layer 14 which has a good step-coverage property as a seed layer for depositing tungsten. Herein, the subscript x representing an atomic ratio of hydrogen with respect to silicon has a value equal to or less than 4. Preferably, under maintenance of a pressure less than approximately 10 Torr, the $SiH_4$ gas is supplied to the substrate 10 heated to a temperature ranging from approximately 400° C. to approximately 500° C. in a vacuum state. As a result, the $SiH_x$ layer 14 is formed at a region in which a surface reaction occurs. At this time, a thickness of the $SiH_x$ layer 14 increases in proportion to an exposure time, and thus, the $SiH_x$ layer 14 is formed with a thickness less than approximately 10 nm in consideration of a thickness of an adhesion layer which will be selectively formed inside of the contact holes 100. The reason for this preset thickness of the SiHx layer 14 is because silicon sources are consumed by approximately 1.2 times to approximately 1.3 times greater than a thickness of a tungsten layer formed by a silicon reduction reaction.

Figure 1B:
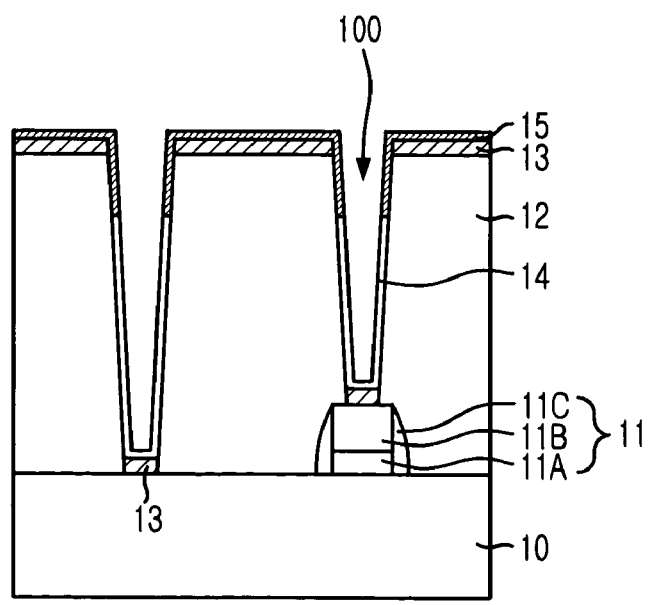

Referring to FIG. 1B, a metal deposition blocking layer 15 is formed by treating a top portion of the $SiH_x$ layer 14 with ammonia ($NH_3$) plasma or oxygen ($O_2$) plasma without a bias supply. Herein, the metal deposition blocking layer 15 is made of a material such as silicon nitride or silicon oxide. Preferably, the $NH_3$ plasma treatment or $O_2$ plasma treatment is carried out ex situ for several minutes without an exposure to atmosphere at a temperature of approximately 400° C. and at a pressure of approximately 50 mTorr along with a power supply of approximately 30 W. At this time, the reason for the ex-situ plasma treatment is to suppress a reaction between the $NH_3$ or $O_2$ plasma and the $SiH_4$ gas possibly remaining within a reaction chamber and thus to prevent generation of defects. Also, if the remaining $SiH_4$ gas is eliminated with use of an inert gas prior to the formation of the metal deposition blocking layer 15, it is possible to apply the $NH_3$ or $O_2$ plasma treatment in situ.

Figure 1C:
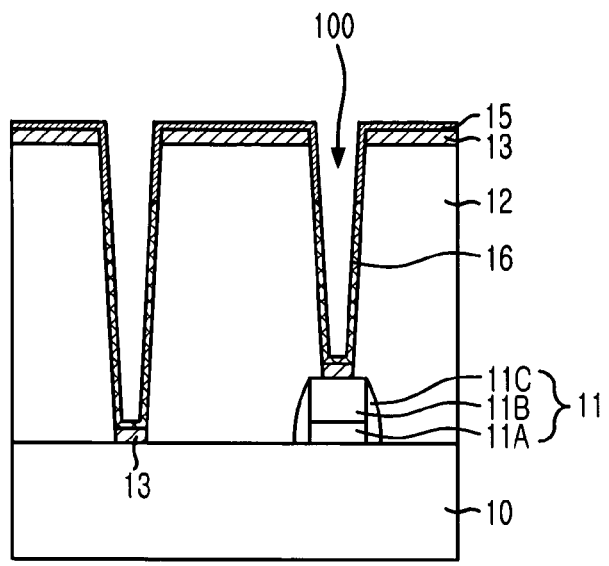

Referring to FIG. 1C, under the use of a portion of the SiH, layer 14 disposed at each bottom and sidewalls of the contact holes 100 as the seed layer for forming a plug, a tungsten layer is formed with a thickness less than approximately 10 nm to thereby form an adhesion layer 16. At this time, the tungsten layer is formed at a temperature less than approximately 300° C. and at a pressure of approximately 1 Torr through a silicon reduction reaction defined below.

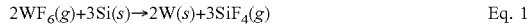

$$2WF_6(g)+3Si(s) \rightarrow 2W(s)+3SiF_4(g) \qquad \text{Eq. 1}$$

If the deposition temperature for the tungsten layer is controlled to be greater than approximately 290° C., a density of the tungsten layer is decreased because of a rapidly increased deposition rate of the tungsten layer greater than approximately 165 nm per minute. Also, it is difficult to accurately control a thickness of the tungsten layer depending on a diameter of each contact hole 100. In addition, if the deposition temperature is controlled to be greater than approximately 450° C., tungsten silicide is formed through a silicide reaction as shown in below.

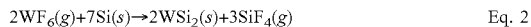

$$2WF_6(g)+7Si(s) \rightarrow 2WSi_2(s)+3SiF_4(g) \qquad \text{Eq. 2}$$

Herein, the tungsten silicide has a rapidly increased resistivity that is approximately 500 $\mu\Omega^-$cm. Also, if the pressure is increased to a predetermined level higher than approximately 1 Torr, the tungsten layer has a self-limiting thickness increased over approximately 60 nm. Thus, it is preferable to determine an optimal process recipe by measuring changes in a deposition rate of the tungsten layer depending on a deposition temperature and a pressure.

Afterwards, impurities generated from the above reactions, e.g., non-reacted $WF_6$, $SiF_4$ and $SiHF_3$ adsorbed onto a surface of the adhesion layer 16, are selectively removed depending on need by using argon (Ar) gas or hydrogen ($H_2$) gas.

Figure 1D:
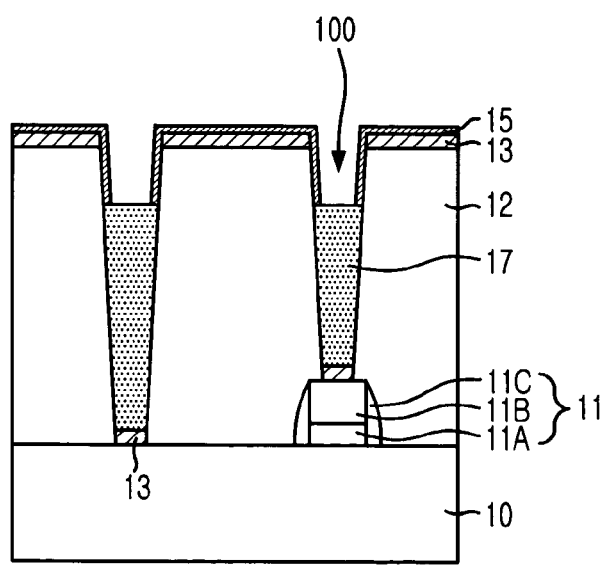

Referring to FIG. 1D, $SiH_4$ gas and $WF_6$ gas are supplied to the adhesion layer 16 shown in FIG. 1C, so that a plug 17 made of tungsten is selectively formed in situ only on the contact holes 100 through a silicon reduction reaction as shown in below.

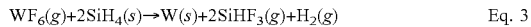

$$WF_6(g)+2SiH_4(s) \rightarrow W(s)+2SiHF_3(g)+H_2(g) \qquad \text{Eq. 3}$$

Preferably, the selective formation of the tungsten layer, which becomes the plug 17, is maximized by carrying out this process at a temperature ranging from approximately 200° C. to approximately 300° C. and at a pressure ranging from approximately 1 mTorr to approximately 1 Torr along with supplying the $WF_6$ gas and the $SiH_4$ gas in a flow quantity ratio of approximately 10 to a value ranging from approximately 2 to approximately 30.

Next, to decrease a resistivity of the plug 17, a selective vacuum heat treatment can be carried out ex situ at a temperature ranging from approximately 400° C. to approximately 600° C. without an exposure to atmosphere. This decreased resistivity of the plug 17 makes it possible to prevent incidences of spiking current possibly generated in case that current having a high density per unit area is supplied to the plug 17 through a metal interconnection line.

Figure 1E:
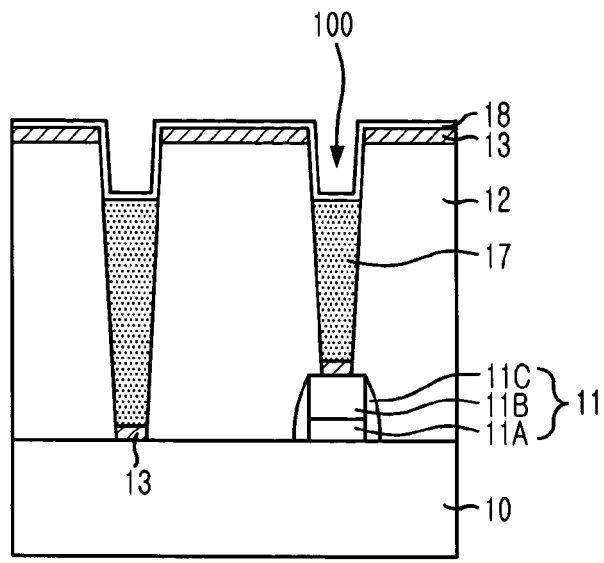

Referring to FIG. 1E, the metal deposition blocking layer 15 shown in FIG. 1D and a native oxide layer formed on the plug 17 are removed by using Ar plasma. Thereafter, a barrier metal layer 18 is formed on the contact holes 100 and the Ti/TiN layer 13. At this time, the barrier metal layer 18 can be one of a Ti/TiN layer, a Ti/WN layer, a Ta layer, and a Ta/TaN/Ta layer.

Figure 1F:
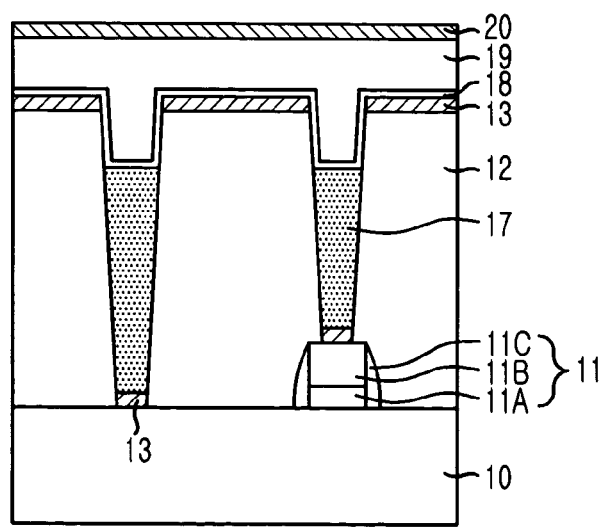

Referring to FIG. 1F, an aluminum (Al) layer 19 for forming a metal interconnection line is formed on the barrier metal layer 18. Then, an anti-reflective coating layer 20 made of a material such as TiN is formed on the aluminum layer 19.

Although not illustrated, the anti-reflective coating layer 20 and the aluminum layer 19 are patterned through a photolithography process and an etching process, thereby obtaining metal interconnection lines.

In accordance with the first embodiment of the present invention, the amorphous $SiH_x$ layer is used as a seed layer for forming the plug made of tungsten, and the metal deposition blocking layer is formed on an upper part of the contact holes. Thus, even without a chemical mechanical polishing (CMP) process and a wet cleaning process, it is possible for the contact holes having a high difference in heights to be filled with the plug material, i.e., tungsten, through a selective deposition method. As a result of this effect, it is possible to simplify processes for forming metal interconnection lines and improve reliability of the metal interconnection lines.

Although the first embodiment exemplifies the use of tungsten as the plug, it is possible to employ aluminum, which is the same material to the metal interconnection lines, as the plug material. In this case, the adhesion layer made of tungsten can be used as a barrier metal layer against the aluminum. Also, it is possible to use the adhesion layer as the barrier metal layer by transforming the adhesion layer into a tungsten nitride ($W_xN$) layer, in which the subscript x representing an atomic ratio has a value equal to or less than approximately 2.

More specifically, the transformation of the adhesion layer into the $W_xN$ layer takes place by heating the adhesion layer at a temperature ranging from approximately 400° C. to approximately 500° C. without an exposure to atmosphere and applying a remote $NH_3$ or $N_2$ plasma treatment thereto.

In addition, it is possible to form the plug made of Al through the use of a selective deposition method carried out at a temperature ranging from approximately 250° C. to approximately 400° C. and at a pressure less than approximately 10 Torr along with use of a source material of dimethylaluminum hydride (DMAH). That is, DMAH, the source material, initiates the deposition by being discomposed after being supplied with electrons from a bottom layer. Thus, it is possible to selectively form the aluminum plug only within the contact holes based on reliance of the DMAH on the barrier metal layer, which is the bottom layer.

FIGS. 2A to 2D are cross-sectional views illustrating a method for forming a metal interconnection line in a semiconductor device with the application of a dual damascene process in accordance with a second embodiment of the present invention.

Figure 2A:
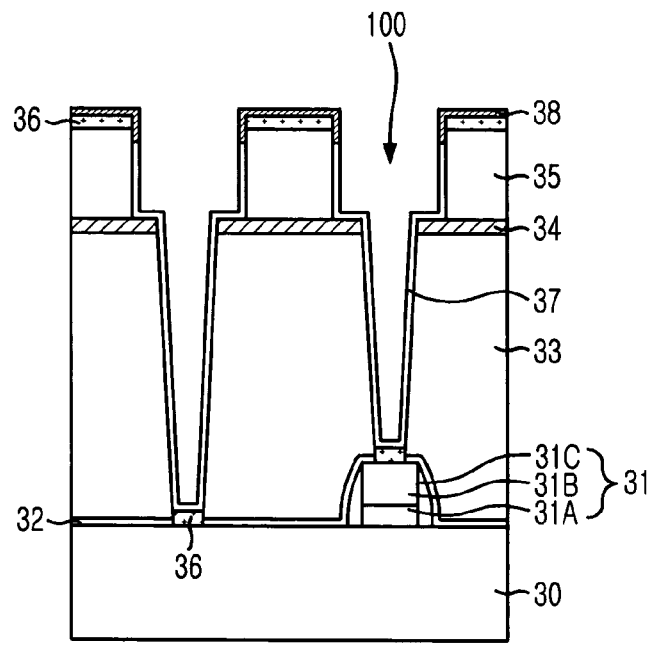
FIGS. 2A to 2D are cross-sectional views illustrating a method for forming a metal interconnection line with the application of a dual damascene process in accordance with a second embodiment of the present invention.

Referring to FIG. 2A, a gate structure 31 including a gate conductive material 31A, a gate hard mask 31B and a gate spacer 31C is formed on a substrate 30. Then, a first etch stop layer 32, a first inter-layer insulation layer 33, a second etch stop layer 34, and a second inter-layer insulation layer 35 are sequentially deposited on the above substrate structure. Herein, the second inter-layer insulation layer 35 is made of a low dielectric material.

Then, a plurality of contact holes 100 having different depths and exposing a portion of the substrate 30 and a portion of the gate structure 31 are formed in the shape of metal interconnection lines and plugs by performing a dual damascene process. A first barrier metal layer 36 made of a material such as Ti or Ta is formed on each bottom of the contact holes 100 and on upper surfaces of the second inter-layer insulation layer 35 by performing a physical vapor deposition (PVD) method. As same as the first embodiment of the present invention, $SiH_4$ gas is supplied to form an amorphous $SiH_x$ layer 37 on the above resulting substrate structure. Herein, the $SiH_x$ layer 37 serves as a seed layer for forming a tungsten layer. The subscript x representing an atomic ratio of hydrogen has a value equal to or less than approximately 4. Then, the SiH, layer 37 is treated with $NH_3$ plasma or $O_2$ plasma to thereby form a metal deposition blocking layer 38 made of a material such as silicon nitride or silicon oxide.

Figure 2B:
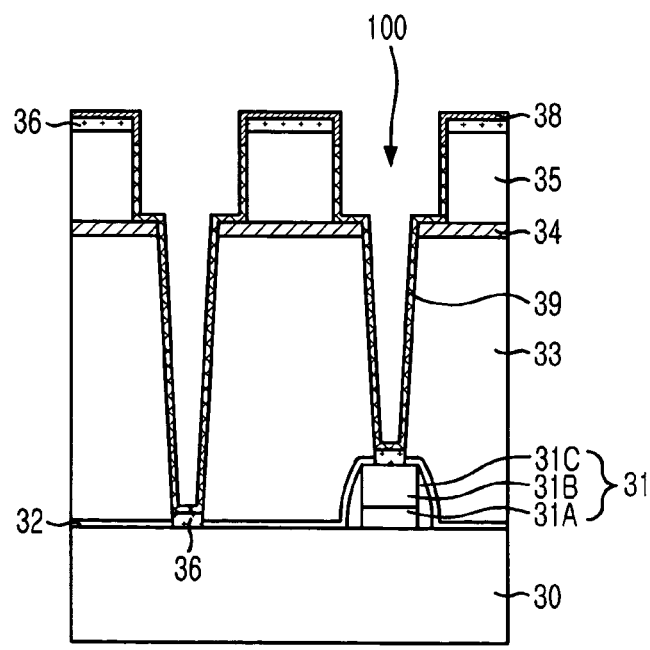

Referring to FIG. 2B, the $SiH_x$ layer 37 disposed at each bottom and sidewalls of the contact holes 100 is used as the seed layer for forming a tungsten layer through a silicon reduction reaction, and then, the tungsten layer is subjected to a remote $NH_3$ plasma treatment to form a second barrier metal layer 39 made of tungsten nitride ($WN_x$).

Figure 2C:
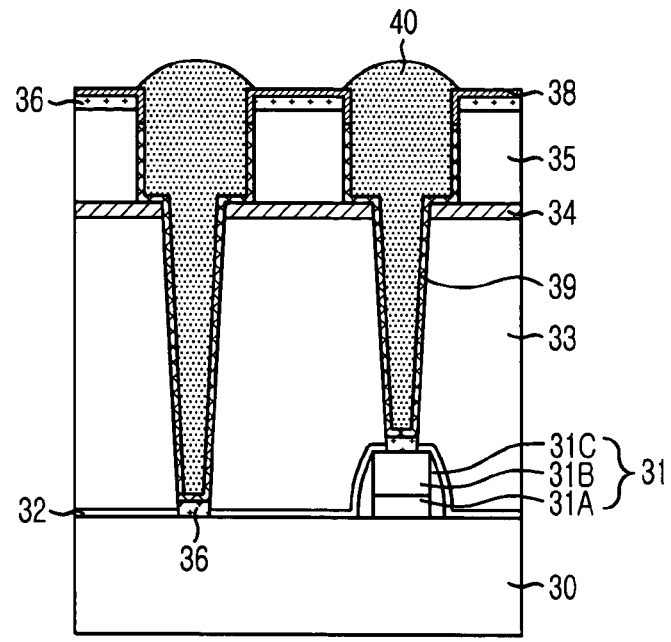

Referring to FIG. 2C, a plurality of metal interconnection lines 40 are formed inside of the contact holes 100 shown in FIG. 2B by selectively forming a copper layer with supply of Cu(hfac)TMVS/Ar gas, or an aluminum layer with supply of a mixed gas of Al and DMAH/H2 to the above resulting substrate structure heated to a temperature ranging from approximately 150° C. to approximately 350° C. Herein, a commercially available form of Cu(hfac)TMVS is called CupraSelect. At this time, in case of the copper layer is formed, it is possible to additionally form a tungsten layer or a molybdenum (Mo) layer with a thickness of approximately 10 nm in order to prevent generation of hillocks in the copper layer. The tungsten layer or the molybdenum layer is selectively formed by supplying a gas of $WF_6/SiH_4$ to the copper layer.

Figure 2D:
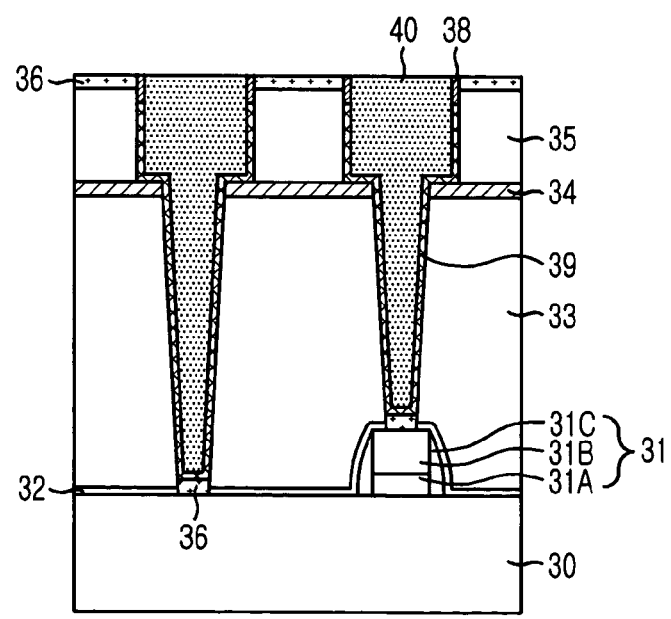

Referring to FIG. 2D, a CMP process or a dry etching process using a gas of $Cl_2/NH_3/SiCl_4$ is performed by using the metal deposition blocking layer 38 as an etch stop layer to planarize the metal interconnection lines 40 by removing excessively grown portions of metal interconnection lines 40. After the planarization process, a cleaning process is performed.

In accordance with the second preferred embodiment of the present invention, since the barrier metal layers are formed in double layers, it is possible to improve barrier characteristics against diffusion of copper, which is a material for the interconnection lines, during the dual damascene process. As a result, it is further possible to improve a resistance characteristic of the metal interconnection lines.

Also, the metal interconnection lines can be formed through more simplified processes by selectively forming the copper layer only inside of the contact holes without an additional electroplating process.

The above method can be applied to a single damascene process, and detailed description on such method will be provided hereinafter.

Figure 3A:
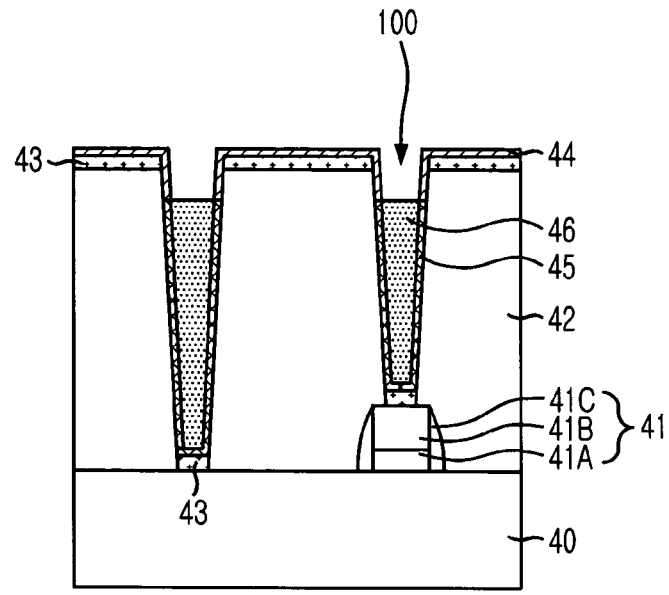
FIGS. 3A to 3C are cross-sectional views illustrating a method for forming a metal interconnection line in a semiconductor device with the application of a single damascene process in accordance with a third embodiment of the present invention.
Figure 3B:
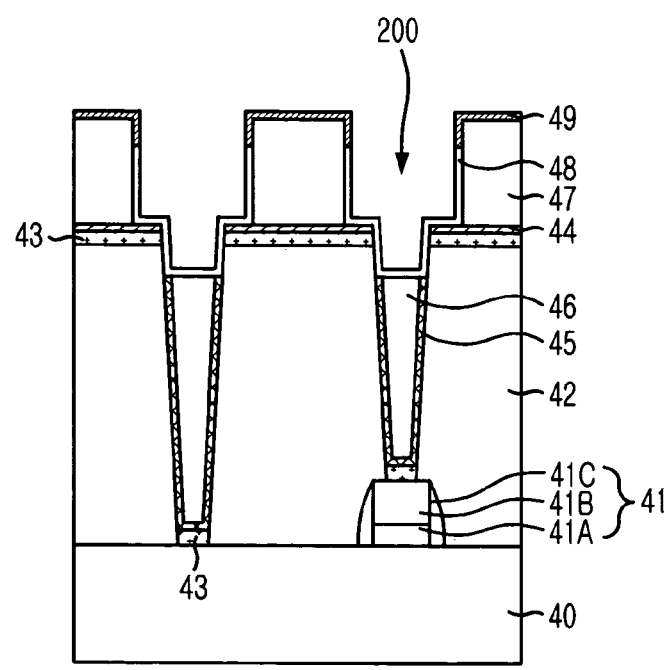
Figure 3C:
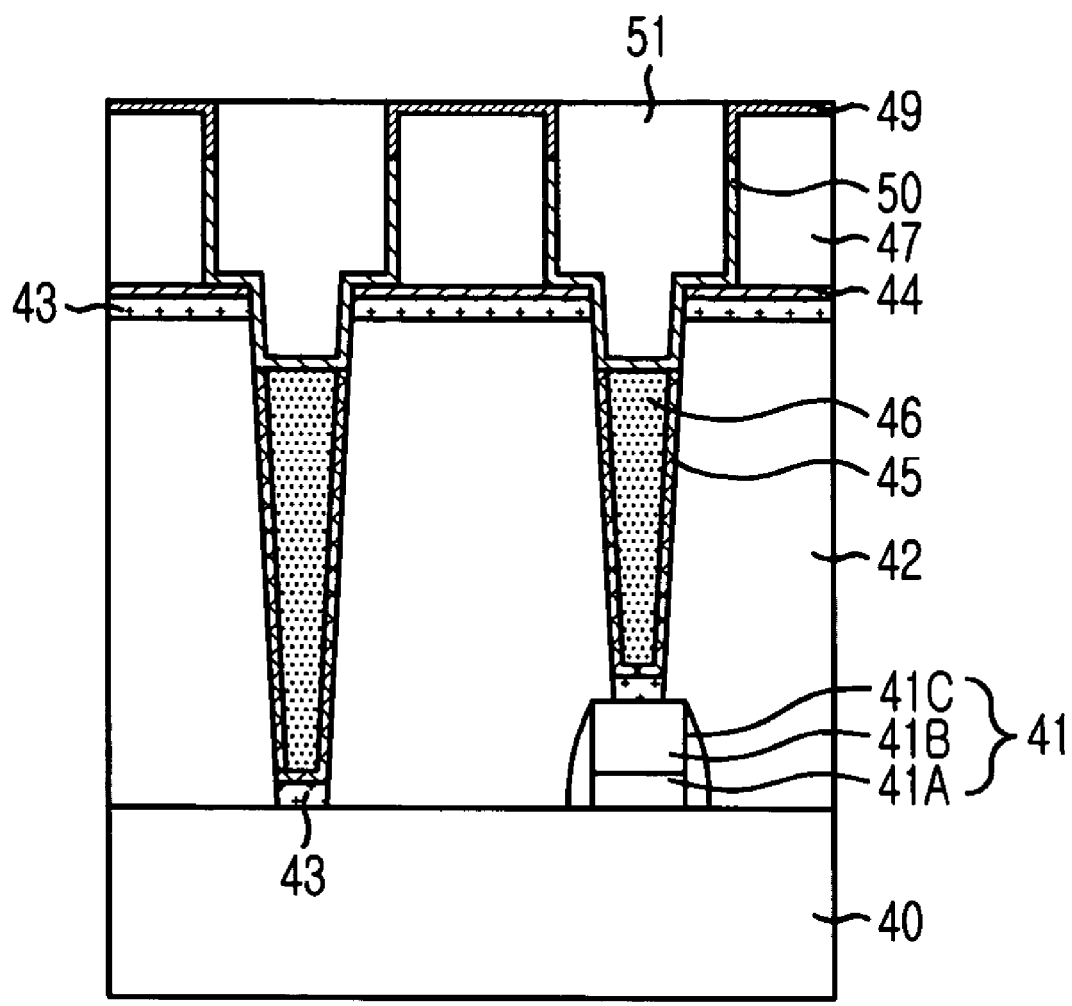

FIGS. 3A to 3C are cross-sectional views illustrating a method for forming a metal interconnection line in a semiconductor device with the application of a single damascene process in accordance with a third embodiment of the present invention.

Referring to FIG. 3A, a gate structure 41 including a gate conductive layer 41A, a gate hard mask 41B and a gate spacer 41C is formed on a substrate 40. Then, a first inter-layer insulation layer 42 is formed on the above resulting substrate structure and is etched to form a plurality of first contact holes 100 having different depths and exposing portions of the substrate 40 and the gate structure 41.

A first barrier metal layer 43 is formed on each bottom of the first contact holes 100 and on upper surfaces of the inter-layer insulation layer 42 by performing a PVD method. Although not illustrated, a first amorphous $SiH_x$ layer, in which the subscript x representing an atomic ratio of hydrogen has a value equal to or less than approximately 4, is formed on the above resulting structure.

On the basis of the same method described in the second embodiment of the present invention, a first metal deposition blocking layer 44 and a second barrier metal layer 45 are sequentially formed with use of the $SiH_x$ layer. Herein, detailed description on the formation of the first metal deposition blocking layer 44 and the second barrier metal layer 45 will be omitted.

Next, a plurality of plugs 46 made of a material selected from a group consisting of Cu, Al and W are formed inside of the first contact holes 100 through a selective deposition method.

Referring to FIG. 3B, a second inter-layer insulation layer 47 is formed on the above resulting substrate structure and is then etched through employing a single damascene process, so that a plurality of second contact holes 200 exposing the plugs 46 are formed in the shape of metal interconnection lines which will be subsequently formed.

As same as the processes described in the second embodiment of the present invention, a second amorphous $SiH_x$ layer 48 is formed on the second contact holes 200 and the second inter-layer insulation layer 47, and then, a second metal deposition blocking layer 49 is formed by using the second $SiH_x$ layer 48.

Referring to FIG. 3C, a third barrier metal layer 50 is formed by using the second $SiH_x$ layer 48 based on the same process described in the second embodiment of the present invention. Then, metal interconnection lines 51 made of a material such as Cu or Al are formed only inside of the second contact holes 200 through a selective deposition method. Afterwards, the excessively grown portions of the metal interconnection lines 51 are removed by using the second metal deposition blocking layer 49 as an etch stop layer to thereby achieve planarization of the metal interconnection lines 51. A cleaning process is performed thereafter.

In accordance with the first to the third embodiments of the present invention, it is possible to simplify processes for forming the metal interconnection lines under the application of the typical metal plug and the damascene process. Also, it is possible to improve reliability of the metal interconnection lines.

The present application contains subject matter related to the Korean patent application No. KR 2003-0073067, filed in the Korean Patent Office on Oct. 20, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a metal interconnection line in a semiconductor device, comprising the steps of:
   forming an inter-layer insulation layer on a substrate, the inter-layer insulation layer having at least one contact hole exposing a portion of the substrate;
   forming a barrier metal layer on a bottom of said at least one contact hole and an upper surface of the inter-layer insulation layer;
   forming an amorphous seed layer on said at least one contact hole;
   converting portions of the seed layer disposed on an upper part of said at least one contact hole into a metal deposition blocking layer;
   selectively forming at least one adhesion layer on the bottom and sidewalls of said at least one contact hole by using the seed layer; and selectively forming at least one plug inside of said at least one contact hole.

2. The method of claim 1, wherein the seed layer is made of a material based on a family of $SiH_x$.

3. The method of claim 2, wherein the seed layer is formed by using a gas of silane ($SiH_4$).

4. The method of claim 3, wherein the seed layer has a thickness less than approximately 10 nm.

5. The method of claim 1, wherein the metal deposition blocking layer is formed through a treatment of ammonia ($NH_3$) plasma.

6. The method of claim 1, wherein the metal deposition blocking layer is formed through a treatment of oxygen ($O_2$) plasma treatment.

7. The method of claim 1, wherein the plug is made of tungsten.

8. The method of claim 1, wherein the plug is made of aluminum.

9. The method of claim 8, wherein, prior to the formation of the plug, the adhesion layer is subjected to a remote NH3 plasma treatment.

10. The method of claim 8, wherein, prior to the formation of the plug, the adhesion layer is subjected to a remote $N_2$ plasma treatment.

11. A method for forming a metal interconnection line in a semiconductor device, comprising the steps of:
    forming an inter-layer insulation layer on a substrate, the inter-layer insulation layer having at least one contact hole exposing a portion of the substrate;
    forming a first barrier metal layer on a bottom of said at least one contact hole and an upper surface of the inter-layer insulation layer;
    forming an amorphous seed layer on said at least one contact hole;
    converting portions of the seed layer disposed on an upper part of said at least one contact hole into a metal deposition blocking layer;
    forming a second barrier metal layer on the bottom and sidewalls of said at least one contact hole by using the seed layer; and
    selectively forming the metal interconnection line inside of said at least one contact hole.

12. The method of claim 11, wherein the seed layer is made of a material based on a family of $SiH_x$.

13. The method of claim 12, wherein the seed layer is formed by using a gas of silane ($SiH_4$).

14. The method of claim 13, wherein the seed layer has a thickness less than approximately 10 nm.

15. The method of claim 11, wherein the metal deposition blocking layer is formed through a treatment of ammonia ($NH_3$) plasma.

16. The method of claim 11, wherein the metal deposition blocking layer is formed through a treatment of oxygen ($O_2$) plasma.

17. The method of claim 11, wherein the second barrier metal layer is formed by forming a metal layer on the bottom and sidewalls of said at least one contact hole through the use of the seed layer and then carrying out a remote $NH_3$ plasma treatment.

18. The method of claim 11, wherein the metal interconnection line is made of copper.

19. The method of claim 11, wherein the metal interconnection line is made of aluminum.

* * * * *